United States Patent
Su

(10) Patent No.: US 10,380,938 B2
(45) Date of Patent: Aug. 13, 2019

(54) BENDABLE DISPLAY PANEL AND DISPLAY DEVICE

(71) Applicant: SHANGHAI TIANMA AM-OLED CO., LTD., Shanghai (CN)

(72) Inventor: Congyi Su, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 0 days.

(21) Appl. No.: 15/866,230

(22) Filed: Jan. 9, 2018

(65) Prior Publication Data

US 2019/0073946 A1    Mar. 7, 2019

(30) Foreign Application Priority Data

Sep. 4, 2017  (CN) .......................... 2017 1 0786056

(51) Int. Cl.
  *G09G 3/32*      (2016.01)
  *G09G 3/3208*    (2016.01)
  *H01L 27/32*     (2006.01)
  *H01L 51/52*     (2006.01)

(52) U.S. Cl.
  CPC ....... *G09G 3/3208* (2013.01); *H01L 27/3262* (2013.01); *H01L 51/5206* (2013.01); *H01L 51/5221* (2013.01); *G09G 2310/0264* (2013.01); *G09G 2320/0233* (2013.01)

(58) Field of Classification Search
  CPC .. G09G 3/3208; G09G 3/3225; G09G 3/3233; G09G 2320/0233; G06F 1/1641; H01L 27/3262
  See application file for complete search history.

(56) References Cited

U.S. PATENT DOCUMENTS

| 2003/0197665 A1* | 10/2003 | Sung | .................... G09G 3/3233 345/82 |
| 2014/0306985 A1* | 10/2014 | Jeong | .................. G09G 3/3233 345/601 |
| 2017/0263690 A1* | 9/2017 | Lee | .................... G02F 1/133305 |

FOREIGN PATENT DOCUMENTS

| CN | 102855821 A | 1/2013 |
| CN | 105374315 A | 3/2016 |
| CN | 205692837 U | 11/2016 |

OTHER PUBLICATIONS

CN First Office Action, Applicaiton No. 201710786056.8, dated Mar. 4, 2019.

* cited by examiner

*Primary Examiner* — Xuemei Zheng
(74) *Attorney, Agent, or Firm* — Alston & Bird LLP

(57) ABSTRACT

Embodiments of the present disclosure provide a display panel and a display device to improve brightness difference between bending position and non-bending position of the display panel. The display panel includes an array substrate including a display area, the display area includes a non-bendable first display area in which a first driving transistor is arranged; a bendable second display area in which a second driving transistor is arranged, a width-length ratio of the first driving transistor being greater than that of the second driving transistor; a first organic light emitting diode arranged in the first display area and including an anode and a cathode, the anode being coupled to the first driving transistor; and a second organic light emitting diode arranged in the second display area and including an anode and a cathode, the anode of the second organic light emitting diode being coupled to the second driving transistor.

15 Claims, 8 Drawing Sheets

BENDABLE DISPLAY PANEL AND DISPLAY DEVICE

CROSS-REFERENCE TO RELATED APPLICATIONS

The present application claims the benefit of priority to Chinese Patent Application No. CN201710786056.8, filed on Sep. 4, 2017, the content of which is incorporated herein by reference in its entirety.

TECHNICAL FIELD

The present disclosure relates to the field of display technologies and, more particularly, relates to a display panel and a display device.

BACKGROUND

With continuous development of display technologies, display panel manufacturing technology is also getting mature. Existing display panels mainly include organic light emitting diode (OLED) panels, liquid crystal display (LCD) panels, plasma display panels (PDP) and so on. An organic light emitting display device, as a self-luminous display device, does not require an independent light source. Thus, the organic light emitting display devices can operate at a low voltage, are lightweight and thin, and can provide high-quality characteristics such as a wide viewing angle, a high contrast and a quick response. Therefore, as a next generation of display devices, the organic light emitting display devices have attracted more attention. In addition, because of the characteristics of being lightweight and thin, the organic light emitting display panels are easier to fold, and thus are applied to the field of flexible display. However, the display effect of foldable display panels needs to be further improved.

SUMMARY

Embodiments of the present disclosure provide a display panel and a display device, which can improve brightness difference caused by different width-length ratios of driving transistors at a bending position and a non-bending position, thereby improving display uniformity.

In one aspect, embodiments of the present disclosure provide a display panel, including: an array substrate having a display area and a non-display area surrounding the display area, wherein the display area includes: a first display area being non-bendable; a second display area being bendable; a first driving transistor arranged in the first display area; a second driving transistor arranged in the second display area; wherein a width-length ratio of the first driving transistor is greater than a width-length ratio of the second driving transistor; wherein a first organic light emitting diode is arranged in the first display area and wherein the first organic light emitting diode includes an anode and a cathode, wherein the anode is coupled to the first driving transistor; and wherein a second organic light emitting diode is arranged in the second display area and wherein the second organic light emitting diode includes an anode and a cathode, wherein the anode of the second organic light emitting diode is coupled to the second driving transistor.

In another aspect, embodiments of the present disclosure provide a display device including a display panel, and the display panel includes: an array substrate having a display area and a non-display area surrounding the display area, wherein the display area includes: a first display area being non-bendable; a second display area being bendable; a first driving transistor arranged in the first display area; a second driving transistor arranged in the second display area; wherein a width-length ratio of the first driving transistor is greater than a width-length ratio of the second driving transistor; wherein a first organic light emitting diode is arranged in the first display area and wherein the first organic light emitting diode includes an anode and a cathode, wherein the anode is coupled to the first driving transistor; and wherein a second organic light emitting diode is arranged in the second display area and wherein the second organic light emitting diode includes an anode and a cathode, wherein the anode of the second organic light emitting diode is coupled to the second driving transistor.

In the display panel and the display device provided by the embodiments of the present disclosure, the first driving transistor is arranged in the non-bendable first display area, and the second driving transistor is arranged in the bendable second display area, the width-length ratio of the first driving transistor being greater than that of the second driving transistor. On one hand, after the second display area is bent, the width-length ratio of the second driving transistor is increased to be close to that of the first driving transistor. That is, after the second display area is bent, a difference between driving current values of the first and second driving transistors is decreased, so that brightness difference caused by the different width-length ratios of the driving transistors at a bending position and a non-bending position is improved. On the other hand, at the same bending condition, the smaller the width-length ratio of the driving transistor is, the smaller the brightness difference caused by the bending of the driving transistor will be. Thus, the width-length ratio of the first driving transistor is set to be greater than that of the second driving transistor, namely, the driving transistor with the smaller width-length ratio being arranged in the bendable second display area, so that an anti-bending performance of the second display area is improved, and influence of bending on brightness becomes smaller.

BRIEF DESCRIPTION OF DRAWINGS

In order to illustrate technical solutions in embodiments of the present disclosure or in the related art more clearly, a brief introduction of the drawings used in the embodiments or the related art will be provided herein. Obviously, the drawings described below are merely some embodiments of the present disclosure, and those skilled in the art can also obtain other drawings according to these drawings without creative work.

DESCRIPTION OF EMBODIMENTS

To make the objectives, technical solutions and advantages of the embodiments of the present disclosure more clear, the technical solutions of the embodiments of the present disclosure will be described clearly and completely by the accompanying drawings. Obviously, the embodiments described are only a part of the embodiments of the present disclosure, rather than all of the embodiments. Based on the embodiments in the present disclosure, all other embodiments obtained by those skilled in the art without creative work shall belong to the protection scope of the present disclosure.

The terms used in the embodiments of the present disclosure are only for describing specific embodiments, which are not intended to limit the present disclosure. The singular form of 'a', 'an', 'the' and 'said' used in the embodiments of the present disclosure and the appended claims is intended to include the plural form, unless otherwise clearly indicated in the context.

Figure 1:
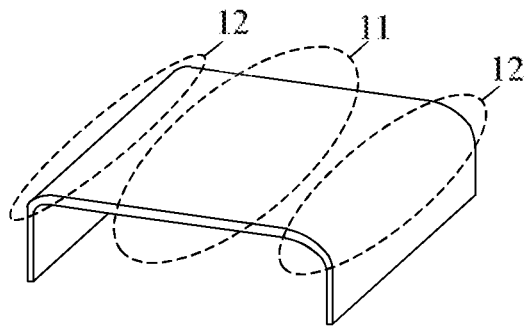
FIG. 1 is a schematic structural view of a display panel according to an embodiment of the present disclosure.
Figure 2:
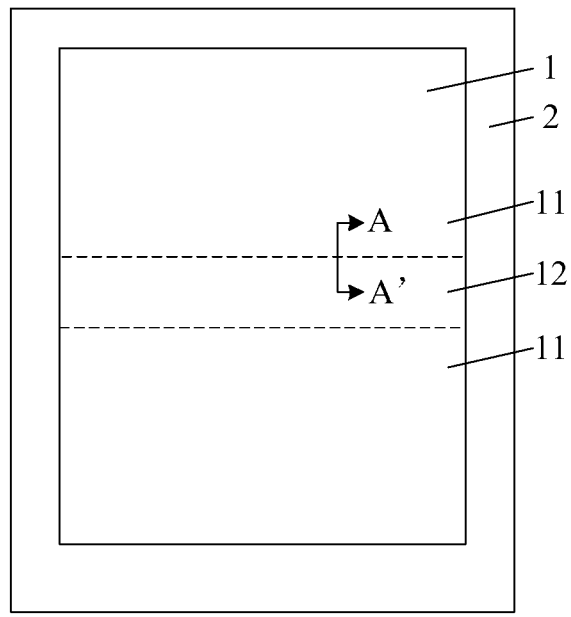
FIG. 2 is a schematic structural view of another display panel according to an embodiment of the present disclosure.
Figure 3:
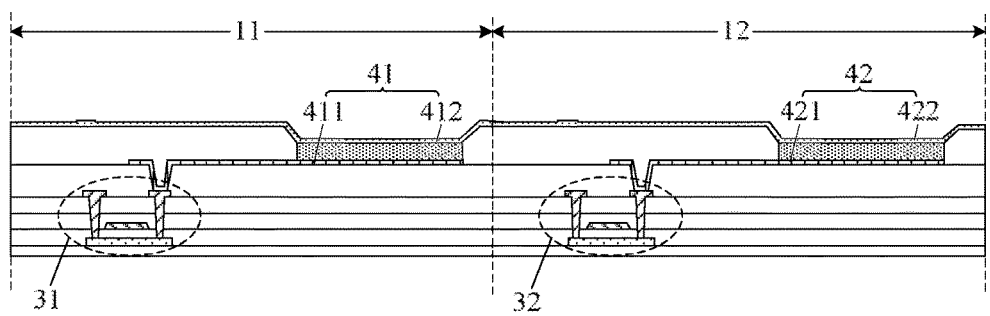
FIG. 3 is a schematic cross sectional view of a display panel structure along a line of AA' shown in FIG. 2.

As shown in FIGS. 1, 2 and 3, FIG. 1 is a schematic structural view of a display panel according to an embodiment of the present disclosure; FIG. 2 is a schematic structural view of another display panel according to an embodiment of the present disclosure; and FIG. 3 is a schematic structural view of a cross-section in a direction of AA' shown in FIG. 2. The display panel provided by an embodiment of the present disclosure includes: an array substrate including a display area 1 and a non-display area 2, wherein the display area 1 includes a non-bendable first display area 11 in which a first driving transistor 31 is arranged; a bendable second display area 12 in which a second driving transistor 32 is arranged, a width-length ratio of the first driving transistor 31 being greater than that of the second driving transistor 32; a first organic light emitting diode 41 arranged in the first display area 11 of the array substrate, the first organic light emitting diode 41 including an anode 411 and a cathode 412, the anode 411 of the first organic light emitting diode 41 being coupled to the first driving transistor 31; and a second organic light emitting diode 42 arranged in the second display area 12 of the array substrate, the second organic light emitting diode 42 including an anode 421 and a cathode 422, the anode 421 of the second organic light emitting diode 42 being coupled to the second driving transistor 32.

The display panel shown in FIG. 1 is a curved display panel. That is, a part of the display panel corresponding to the first display area 11 of the display panel has a planar structure, and a part of the display panel corresponding to the second display area 12 of the display panel has a bent structure. The display panel shown in FIG. 2 is a flexible display panel. That is, a part of the display panel corresponding to the first display area 11 of the display panel is of a non-bendable structure, and a part of the display panel corresponding to the second display area 12 of the display panel is of a bendable structure. A plurality of organic light emitting diodes is arranged in the display area 1 of the display panel; each organic light emitting diode is correspondingly provided with a pixel driving circuit for driving the organic light emitting diode to emit light; each pixel driving circuit includes a driving transistor for driving the corresponding organic light emitting diode to emit light by a driving current thereof.

Figure 4:
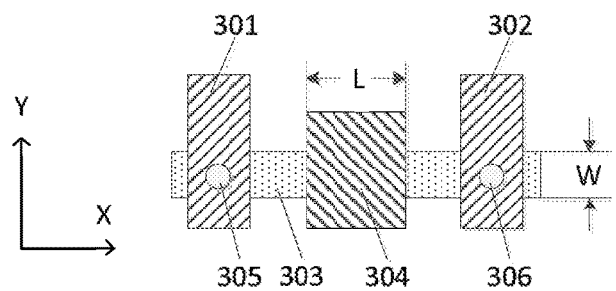
FIG. 4 is a top view of a first driving transistor and a second driving transistor shown in FIG. 3.

Referring to FIG. 4, FIG. 4 is a top view of the first driving transistor and the second driving transistor whose cross sections are shown in FIG. 3. Here, the first driving transistor is taken as an example for illustration. The first driving transistor 31 includes a source electrode 301, a drain electrode 302, an active layer 303 and a gate electrode 304, wherein the source electrode 301 is connected to one end of the active layer 303 through a first via hole 305; the drain electrode 302 is connected to the other end of the active layer 303 through a second via hole 306; the gate electrode 304 is located between the source electrode 301 and the drain electrode 302; and the gate electrode 304 and the active layer 303 are overlapped. The active layer 303 is provided with a channel area which is an overlapping area of an orthographic projection of the gate electrode 304 on the active layer 303 and the active layer 303. The length of the active layer 303 in the channel area is a channel length L of the first driving transistor; the width of the active layer 303 in the channel area is a channel width W of the first driving transistor; and a width-length ratio of the first driving transistor is W/L. In the organic light emitting display panel, the organic light emitting diode and the driving transistor coupled to the organic light emitting diode are arranged in the display area, and a driving current of the driving transistor determines the brightness of the organic light emitting diode. However, the inventor found that after the display area using the same driving circuit is bent, display of the bendable area and the non-bendable area is not uniform. After research, it has been found that the display non-uniformity is caused by a difference between driving currents in the bendable area and the non-bendable area. After studying the cause of the difference in the driving currents, the inventor found that the width-length ratio of the driving transistor at the bending position changes after the organic light emitting display panel is bent, and a driving current value is related to the width-length ratio of the driving transistor, so that there is a difference in brightness between the bendable position and the non-bendable position of the display panel, resulting in display non-uniformity. In the embodiment of the present disclosure, the width-length ratio of the first driving transistor 31 is set to be greater than the width-length ratio of that of the second driving transistor 32. That is, a driving transistor with a smaller width-length ratio is arranged in the bendable second display area. The inventor found through an experiment that the smaller the width-length ratio of the driving transistor is, the smaller the change of the driving current caused by the change of the width-length ratio will be. When the display panel is bent in the bendable area, the width-length ratio of this area changes, so that the width-length ratio of the first driving transistor 31 is set to be greater than that of the second driving transistor 32 to reduce the difference between the width-length ratio of the driving transistor in the bendable area and the width-length ratio of the driving transistor in the non-bendable area caused by bending, thereby enabling the driving currents generated by the driving transistors to be uniform, and improving the brightness uniformity. In addition, the smaller the width-length ratio of the driving transistor is, the better the bending performance will be. In the embodiment of the present disclosure, the width-length ratio of the first driving transistor 31 is set to be greater than that of the second driving transistor 32, so that the anti-bending performance of the second display area can also be improved, thereby reducing the influence on the brightness during bending, and enabling the display to be more uniform. Referring to FIG. 4, when a bending axis direction of the bendable area is a Y direction (the Y direction is perpendicular to the channel length L of the second driving transistor), after bending, the channel length L of the second driving transistor in the bendable area increases, and the channel width W of the second driving transistor is substantially constant. Therefore, the width-length ratio W/L of the driving transistor in the second area after bending is reduced. In the embodiment of the present disclosure, as the width-length ratio of the first driving transistor 31 is set to be greater than that of the second driving transistor 32, and the smaller the width-length ratio of the driving transistor is, the smaller the change of the width-length ratio of the driving transistor caused by the bending will be, so that the change of the width-length ratio of the second driving transistor in the second display area, caused by the bending, can be reduced, and a difference between the driving currents of the driving transistors in the first display area and the second display area due to the bending is reduced, thereby improving the brightness uniformity. When the bending axis direction is an X direction (the X direction is parallel to the channel length L of the second driving transistor), after bending, the channel length L of the second driving transistor in the second display area is substantially constant, and the channel width W of the second driving transistor increases. Therefore, the width-length ratio of the driving transistor in the second area becomes greater. In the embodiment of the present disclosure, as the width-length ratio of the first driving transistor 31 is set to be greater than that of the second driving transistor 32, the difference between the width-length ratio of the first driving transistor in the first display area and the width-length ratio of the second driving transistor in the second display area, caused by the bending, can be effectively reduced, thereby reducing the difference between the driving currents of the first display area and the second display, and enabling the brightness in the first display area and the second display area to be uniform. Therefore, in the embodiment of the present disclosure, the width-length ratio of the first driving transistor 31 is set to be greater than that of the second driving transistor 32, namely, the driving transistor with a smaller width-length ratio being arranged in the bendable second display area, so that the influence of bending on the brightness uniformity can be effectively reduced to improve the display effect. It should be noted that the X direction in FIG. 4 may be an extending direction of a gate scan line in the display panel, and the Y direction is an extending direction of a data line in the display panel. Alternatively, the X direction in FIG. 4 is the extending direction of the data line in the display panel, and the Y direction is the extending direction of the gate scan line in the display panel, which are not limited herein.

In addition, Table 1 is a brightness contrast table of an organic light emitting diode corresponding to a driving transistor with a first reference value. Table 2 is a brightness contrast table of an organic light emitting diode corresponding to a driving transistor with a second reference value. Table 3 is a brightness contrast table of an organic light emitting diode corresponding to a driving transistor with a third reference value.

TABLE 1

|  | Increase of the channel width by 0.1 micron | Channel length and width reference values | Increase of the channel length by 0.1 micron | Increase of the channel length and width by 0.1 micron respectively |
| --- | --- | --- | --- | --- |
| Channel width | 2.6 | 2.5 | 2.5 | 2.6 |
| Channel length | 15 | 15 | 15.1 | 15.1 |
| Width-length ratio | 0.1733 | 0.1667 | 0.1656 | 0.1722 |
| Brightness change | 104.0000% | 100.0000% | 99.3377% | 103.3113% |

TABLE 2

|  | Increase of the channel width by 0.1 micron | Channel length and width reference values | Increase of the channel length by 0.1 micron | Increase of the channel length and width by 0.1 micron respectively |
| --- | --- | --- | --- | --- |
| Channel width | 2.8 | 2.7 | 2.7 | 2.8 |
| Channel length | 19 | 19 | 19.1 | 19.1 |
| Width-length ratio | 0.1474 | 0.1421 | 0.1414 | 0.1466 |
| Brightness change | 103.7037% | 100.0000% | 99.4764% | 103.1608% |

TABLE 3

|  | Increase of the channel width by 0.1 micron | Channel length and width reference values | Increase of the channel length by 0.1 micron | Increase of the channel length and width by 0.1 micron respectively |
| --- | --- | --- | --- | --- |
| Channel width | 3.1 | 3 | 3 | 3.1 |
| Channel length | 25 | 25 | 25.1 | 25.1 |
| Width-length ratio | 0.1240 | 0.1200 | 0.1195 | 0.1235 |
| Brightness change | 103.3333% | 100.0000% | 99.6016% | 102.9216% |

In each of the Tables 1, 2 and 3, the third column shows the driving transistor whose channel length and width are reference values, the second column shows the driving transistor whose channel width is increased by 0.1 micron compared with the reference value, the fourth column shows the driving transistor whose channel length is increased by 0.1 micron compared with the reference values, and the fifth column shows the driving transistor whose channel length and width are respectively increased by 0.1 micron compared with the reference values; and the second row shows the channel width of each driving transistor, the third row shows the channel length of each driving transistor, the fourth row shows the width-length ratio of each driving transistor, and the fifth row shows a ratio of brightness of the organic light emitting diode corresponding to each driving transistor to that of an organic light emitting diode corresponding to the driving transistor with the channel length and width reference values. In the same bending condition, the channel length and width of the driving transistor are changed by the same value. As shown in Tables 1, 2 and 3, it can be seen that the smaller the width-length ratio of the driving transistor is, under the same bending condition, the smaller the brightness change of the corresponding organic light emitting diode will be. That is, the smaller the width-length ratio of the driving transistor is, the higher the anti-bending performance will be thereof. Therefore, the width-length ratio of the first driving transistor 31 is set to be greater than that of the second driving transistor 32, that is, the driving transistor with a smaller width-length ratio is arranged in the bendable second display area 12, so as to improve the anti-bending performance of this area, and enable the brightness difference caused by bending to be as small as possible.

In the display panel provided by the embodiment of the present disclosure, the first driving transistor is arranged in the non-bendable first display area; and the second driving transistor is arranged in the bendable second display area, the width-length ratio of the first driving transistor is greater than that of the second driving transistor. On one hand, after the second display area is bent, the width-length ratio of the second driving transistor is increased to be close to the width-length ratio of the first driving transistor. That is, after the second display area is bent, a difference between driving current values of the first and second driving transistors is decreased, so that a brightness difference caused by the different width-length ratios of the driving transistors at a bending position and a non-bending position is improved. On the other hand, at the same bending condition, the smaller the width-length ratio of the driving transistor is, the smaller the brightness difference caused by the bending of the driving transistors will be. Thus, the width-length ratio of the first driving transistor is set to be greater than that of the second driving transistor, namely, the driving transistor with the smaller width-length ratio being arranged in the bendable second display area, so that an anti-bending performance of the second display area is improved, and influence of bending on the brightness becomes smaller.

Optionally, as shown in FIG. 3, a difference between the width-length ratio of the first driving transistor 31 and the width-length ratio of the second transistor 32 is j, and a ratio of the j to the width-length ratio of the first driving transistor 31 is k, wherein k is smaller than 70%.

As shown in FIGS. 3 and 4, in the spatial layout of the present display panel, the channel widths W of the transistors are set as minimum values. On the premise that W is a fixed value, the smaller the width-length ratio of the transistor is, the greater the channel length L of the transistor will be. Thus, the smaller the width-length ratio of the transistor is, the larger the space occupied by the transistor will be, that is, the larger the area of corresponding sub-pixels will be. On the other hand, the more the transistors in a pixel driving circuit, the larger the space occupied by the pixel driving circuit, that is, the larger the area of corresponding sub-pixels. In order to equalize aperture ratios of all sub-pixels and increase space utilizations in the sub-pixels, it is necessary to take the design of the width-length ratios of the driving transistors and the number of the transistors in the pixel driving circuits into account, so as to enable space occupation ratios in the sub-pixels of the first display area 11 and the second display area 12 to be substantially the same. The inventor determines a relationship between the width-length ratio of the first driving transistor 31 and that of the second driving transistor 32 by taking one of the following achievable transistor number setting manners as an example. A pixel driving circuit of the first driving transistor 31 is composed of seven transistors and one capacitor; the channel width of the first driving transistor 31 is 2.5 microns; the channel length of the first driving transistor 31 is 11 microns; and the width-length ratio of the first driving transistor 31 is 22.73%. A pixel driving circuit of the second driving transistor 32 is composed of two transistors and one capacitor; the channel width of the second driving transistor 32 is 2.5 microns; the channel length of the second driving transistor 32 is 30 microns; and the width-length ratio of the second driving transistor 32 is 8.33%. Here, j=22.73%−8.33%=14.4%, and k is approximately equal to 63.33 (14.4%/22.73%), where j represents a difference between the width-length ratio of the first driving transistor and that of the second transistor, and k represents a ratio of j to the width-length ratio of the first driving transistor. On one hand, in order to realize a basic function of each pixel driving circuit, at least two transistors and one capacitor need to be arranged. On the other hand, the pixel driving circuit composed of the seven transistors and the capacitor is sufficient to realize the function of the pixel driving circuit and to have a required property. If the pixel driving circuit is composed of more transistors, the risk in the process under the current display panel spatial layout is higher. Thus, in consideration of the above two reasons, other process errors and variable ranges of other parameters, k is set to be smaller than 70%. When k is in this range, the space utilizations in the sub-pixels may be increased as much as possible while ensuring that the aperture ratios of the sub-pixels are the same, so as to enable the space occupation of the sub-pixels corresponding to the first driving transistor 31 and that of the second driving transistor 32 to be substantially the same.

Optionally, the first display area 11 includes a plurality of first pixel driving circuits, each of which includes a first driving transistor 31; the second display area 12 includes a plurality of second pixel driving circuits, each of which includes a second driving transistor 32; and the number of the transistors in the first pixel driving circuit is the same as that of the transistors in the second pixel driving circuit. It is well known that the pixel driving circuit typically only includes one driving transistor for driving the light emitting diode in the driving pixel circuit to emit light, and further includes at least one transistor for controlling transmission of an electrical signal, such as a reference signal, a scanning start signal, a data signal and a PVDD signal, at different driving times to realize the change of a voltage of each node in the pixel circuit at different times. As a working process of the pixel circuit is not the focus of the present disclosure, the working process and principle of the pixel circuit are not explained in detail in the present disclosure. The number of the transistors in the first pixel driving circuit mentioned in the present embodiment is the same as that of the transistors in the second pixel driving circuit, that is, the numbers of all kinds of transistors, including the driving transistors, are the same.

In an arrangement manner that the number of transistors in the first pixel driving circuit is the same as that of the transistors in the second pixel driving circuit, space occupation ratios in the sub-pixels is not taken into account, but compatibility in the driving process is considered. As the first pixel driving circuit and the second pixel driving circuit are composed of the same number of transistors, transistor connecting manners of the first and second pixel driving circuits may be exactly the same. That is, the first and second pixel driving circuits adopt the same driving principle. Driving processes of the first display area 11 and the second display are 12 are exactly the same, so that the pixel driving circuits may be controlled by the same driving chip and the same scanning mode, and modification of the display panel is minor.

Optionally, the first display area 11 includes a plurality of first pixel driving circuits, each of which includes a first driving transistor 31; the second display area 12 includes a plurality of second pixel driving circuits, each of which includes a second driving transistor 32; and the number of the transistors in the first pixel driving circuit is different from that of the transistors in the second pixel driving circuit. As described in the foregoing embodiment, the number of the transistors in the first pixel driving circuit mentioned in the present embodiment is different from that of the transistors in the second pixel driving circuit, that is, the numbers of all kinds of transistors, including the driving transistors, are different.

In an arrangement manner that the number of transistors in the first pixel driving circuit is different from that of the transistors in the second pixel driving circuit, the principles of the first pixel driving circuit and the second pixel driving circuit are different. That is, different pixel driving circuits may be further selected according to characteristics of the first display area 11 and the second display area 12.

Optionally, the number of transistors in the first driving circuit is greater than that of transistors in the second driving circuit. As described in the foregoing embodiments, the number of transistors in the first pixel driving circuit mentioned in the present embodiment is greater than that of the transistors in the second pixel driving circuit, that is, the number of all the transistors, including the driving transistors, in the first pixel driving circuit is greater than that of all the transistors, including the driving transistors, in the second pixel driving circuit.

The smaller the width-length ratio of the transistor is, the larger the space occupied by the transistor will be, that is, the larger the area of corresponding sub-pixels. On the other hand, the more the transistors in the pixel driving circuit, the larger the space occupied by the pixel driving circuit, that is, the larger the area of corresponding sub-pixels. In order to equalize aperture ratios of all sub-pixels and increase space utilizations in the sub-pixels, when it is set that the number of the transistors in the first driving circuit is greater than that of the transistors in the second driving circuit, space occupation of the sub-pixels of the first display area 11 and that of the second display area 12 may be substantially the same.

Figure 5:
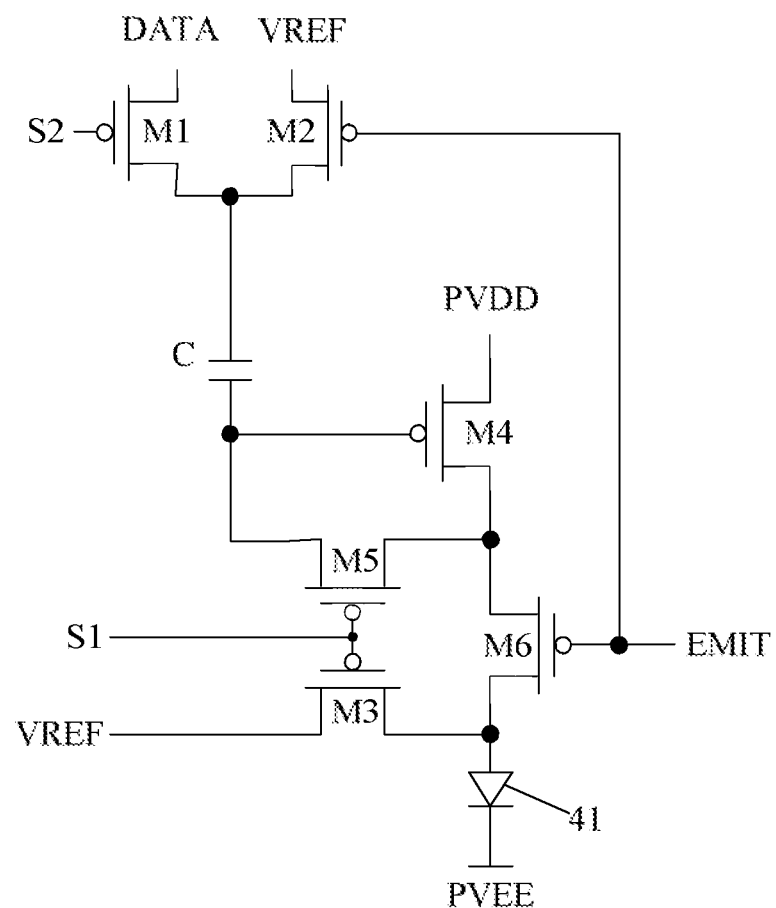
FIG. 5 is a schematic view of a first pixel driving circuit according to an embodiment of the present disclosure.
Figure 6:
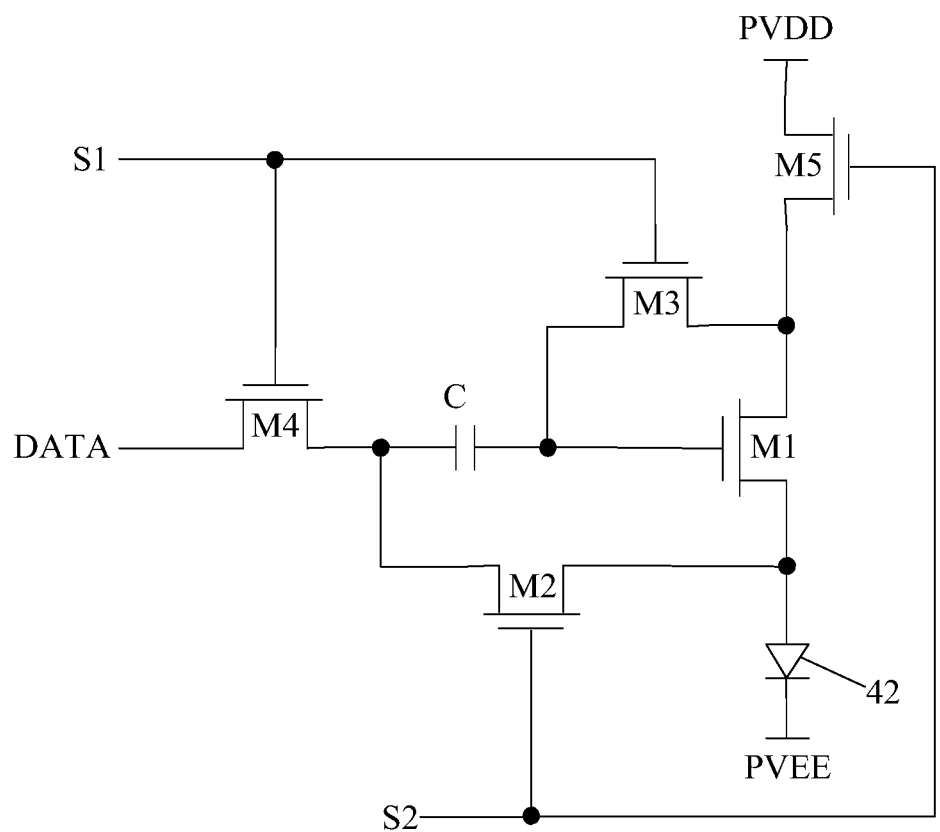
FIG. 6 is a schematic view of a second pixel driving circuit according to an embodiment of the present disclosure.

Optionally, as shown in FIG. 5, FIG. 5 is a schematic view of a first pixel driving circuit according to an embodiment of the present disclosure. Each first pixel driving circuit is composed of six transistors and one capacitor. As shown in FIG. 6, FIG. 6 is a schematic view of a second pixel driving circuit according to an embodiment of the present disclosure. Each pixel driving circuit is composed of five transistors and one capacitor.

As shown in FIG. 5, the first pixel driving circuit includes a first transistor, a second transistor, a third transistor, a fourth transistor, a fifth transistor and a sixth transistor, namely M1 to M6, as well as a storage capacitor C, a first scanning end S1, a second scanning end S2, a light emitting control section EMIT, a data signal line DATA, a reset signal line VREF, a first power supply voltage terminal PVDD and a second power supply voltage terminal PVEE, wherein the fourth transistor M4 is the first driving transistor. As shown in FIG. 6, the second pixel driving circuit includes a first transistor, a second transistor, a third transistor, a fourth transistor and a fifth transistor, namely M1 to M5, a storage capacitor C, a first scanning end S1, a second scanning end S2, a data signal line DATA, a first power supply voltage terminal PVDD, and a second power supply voltage terminal PVEE, wherein the first transistor M1 is the second driving transistor. Both of the two pixel driving circuits shown in FIGS. 5 and 6 can realize threshold voltage compensation to improve display defect caused by threshold voltage drift of the driving transistors.

Figure 7:
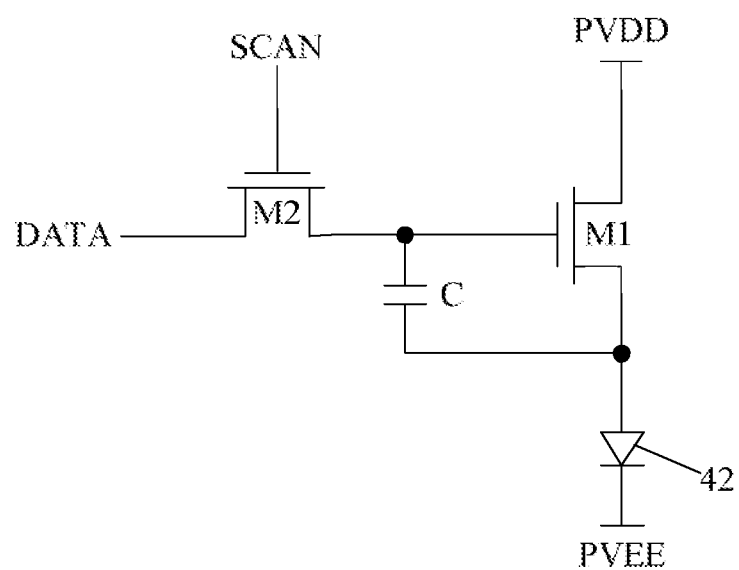
FIG. 7 is a schematic view of another second pixel driving circuit according to an embodiment of the present disclosure.

Optionally, as shown in FIG. 5, each first pixel driving circuit is composed of six transistors and one capacitor. As shown in FIG. 7, FIG. 7 is a schematic view of another second pixel driving circuit according to an embodiment of the present disclosure. Each pixel driving circuit is composed of two transistors and one capacitor.

As shown in FIG. 5, the first pixel driving circuit includes a first transistor, a second transistor, a third transistor, a fourth transistor, a fifth transistor and a sixth transistor, namely M1 to M6, as well as a storage capacitor C, a first scanning end S1, a second scanning end S2, a light emission control section EMIT, a data signal line DATA, a reset signal line VREF, a first power supply voltage terminal PVDD and a second power supply voltage terminal PVEE, wherein the fourth transistor M4 is the first driving transistor. As shown in FIG. 7, the second pixel driving circuit includes a first transistor M1, a second transistor M2, a storage capacitor C, a scanning signal end SCAN, a data signal line DATA, a first power supply voltage terminal PVDD, and a second power supply voltage terminal PVEE, wherein the first transistor M1 is the second driving transistor. In the two pixel driving circuits shown in FIGS. 5 and 7, the difference between the numbers of the transistors in the two pixel driving circuits is relatively large. Thus, in order to equalize aperture ratios of all sub-pixels and increase space utilizations in the sub-pixels, space occupation of the sub-pixels of the first display area 11 and that of the second display area 12 may be substantially the same. That is, a difference between the first driving transistor 31 and the second driving transistor 32 may be set to be larger. When a bending curvature in the second display area 12 is larger, the larger the set difference between the width-length ratios of the first driving transistor 31 and the second driving transistor 32, the better the effect of improving brightness difference between a bending position and a non-bending position. However, the second pixel driving circuit shown in FIG. 7 only includes two transistors, and cannot realize threshold voltage compensation compared with the second pixel driving circuit shown in FIG. 6, so that it is likely to cause threshold voltage drift of the driving transistors, further resulting in a display defect. If threshold voltage compensation is performed on the second pixel driving circuit shown in FIG. 7, another circuit or driving chip outside the display area is required to realize the threshold voltage compensation in a cooperative manner. However, using another circuit to realize the threshold voltage compensation may occupy more space in the non-display area, it is not conducive to the realization of a narrow frame. Using the driving chip to realize the threshold voltage compensation needs a higher design requirement, and a higher cost.

It should be noted that in the present disclosure, the pixel circuits shown in FIGS. 5, 6 and 7 are three circuits composed of different numbers of transistors, which are selected randomly for illustration, while connections and the numbers of these circuits may be similar to those in any other pixel circuits. Here, they are only exemplary, but not limited.

Figure 8:
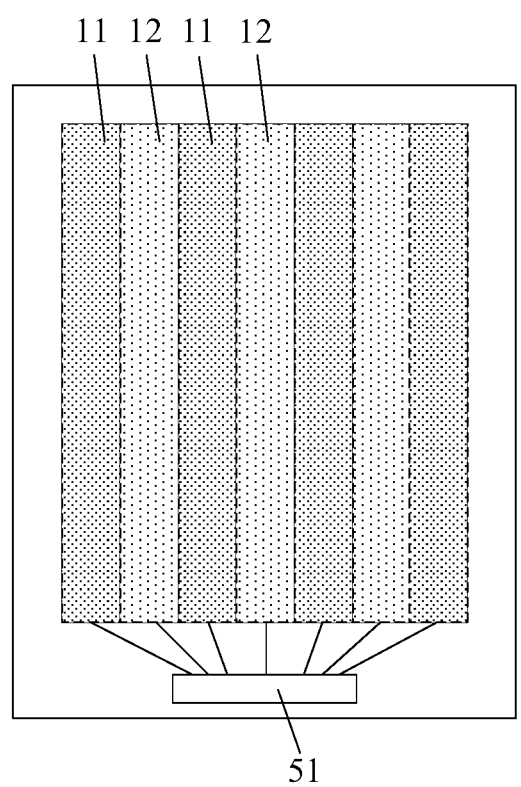
FIG. 8 is a schematic top view of another display panel structure according to an embodiment of the present disclosure.

Optionally, as shown in FIG. 8, FIG. 8 is a schematic structural view of another display panel according to an embodiment of the present disclosure. The display panel further includes a first pixel driving chip 51 electrically connected to the first pixel driving circuit in the first display panel 11 and to a second pixel driving circuit in the second display area 12.

If principles of the first pixel driving circuit and the second pixel driving circuit are the same, or the principles of the first pixel driving circuit and the second pixel driving circuit are different but driving modes of the data lines are the same, the data signals may be simultaneously sent to the first pixel driving circuit in the first display area 11 and the second pixel driving circuit in the second display area 12 via a first pixel driving chip 51. By using only one first pixel driving chip 51 to simultaneously drive the first pixel driving circuit in the first display area 11 and the second pixel driving circuit in the second display area 12, the cost is lower.

Figure 9:
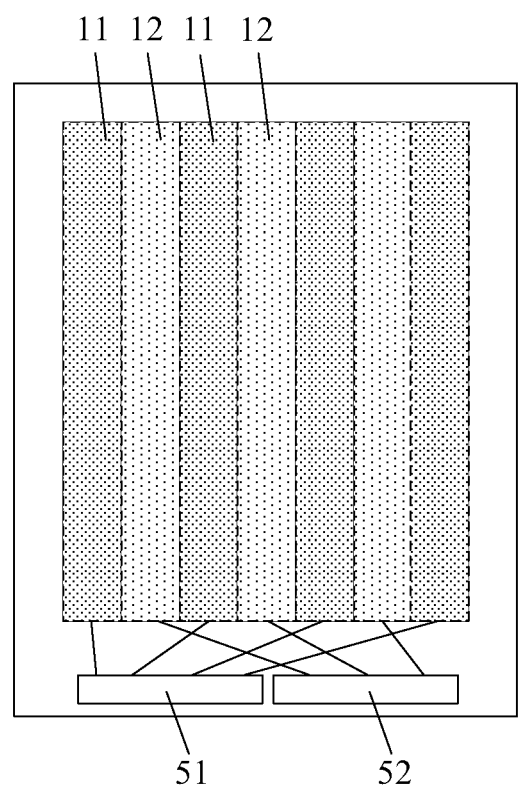
FIG. 9 is a schematic top view of still another display panel structure according to an embodiment of the present disclosure.

Optionally, as shown in FIG. 9, FIG. 9 is a schematic structural view of another display panel according to an embodiment of the present disclosure. The display panel further includes a first pixel driving chip 51 electrically connected to the first pixel driving circuit in the first display panel 11, and a second pixel driving chip 52 electrically connected to the second pixel driving circuit in the second display area 12.

If the driving modes of the data lines in the first pixel driving circuit and the second pixel driving circuit are different, it is necessary to separately arrange the first pixel driving chip 51 corresponding to the first pixel driving circuit and a second pixel driving chip 52 corresponding to the second pixel driving circuit, so that the first display area 11 and the second display area 12 can be controlled by the two chips, respectively. As the width-length ratio of the first driving transistor 31 is greater than that of the second driving transistor 32, when neither the first display area nor the second display area is bent, and the first driving transistor 31 and the second driving transistor 32 adopt the same driving circuit, there is a difference between driving currents of the first driving transistor 31 and the second driving transistor 32, resulting in non-uniform brightness of the first display area 11 and the second display area 12. According to a driving current value formula, $$I \propto \frac{1}{2} C_{OX} \frac{W}{L} (V_{gs} - V_{th})^2,$$

wherein I represents a driving current value, $C_{OX}$ represents a constant associated with the driving transistor, W represents a channel width of the driving transistor, L represents a channel length of the driving transistor, $V_{gs}$ represents a gate-source voltage of the driving transistor, and $V_{th}$ represents a threshold voltage of the driving transistor, namely, the driving current value being also related to $V_{gs}$. The $V_{gs}$ of the first display area 11 and that of the second display area 12 are adjusted by the two driving chips, respectively, and the driving current difference caused by the width-length ratio difference between the first and second driving transistors is compensated when neither the first display area nor the second display area is bent, so as to enable the display brightness to be uniform. It is more flexible and accurate to realize the adjustment of the $V_{gs}$ of the first display area 11 and that of the second display area 12 by the two driving chips, respectively.

Optionally, the display panel is a flexible display panel. The present disclosure does not limit a material of a flexible substrate. Optionally, the material of the flexible substrate may be an organic polymer. As an example, the organic polymer may be polyimide (PI), polyamide (PA), polycarbonate (PC), polyether sulfone (PES), polyethylene terephthalate (PET), polyethylene naphthalate (PEN), polymethylmethacrylate (PMMA) or cycloolefin copolymer (COC). Particularly, there are two types of flexible display panels in the present disclosure, one is a display panel having a bent structure after manufacture of a display device including this display panel is completed, and the other is a display panel which can be bent under an operation of a user after the manufacture of a display device including this display panel is completed.

It should be noted that, for the display panel having the bent structure after the manufacture of the display device is completed, as a bending curvature of the second display area after bending does not change any more, it is only necessary to preset the width-length ratio of the first driving transistor to be greater than that of the second driving transistor. Thus, after the bending of the second display area, the brightness difference between the first display area and the second display area in the finally formed display panel may be smaller. For the other display device, its display panel may be bent under the operation of the user. That is, the bending curvature of the second display area after bending may change. For example, in some scenarios, the user will flatten the second display area, namely, the second display area not being bent. As the preset width-length ratio of the first driving transistor is greater than that of the second driving transistor, and the driving current value I of each driving transistor is proportional to the threshold gate-source voltage $V_{gs}$ of the driving transistor, the corresponding driving chip can adjust the threshold gate-source voltage $V_{gs}$ of the driving transistor according to the bending curvature of the second display area. Therefore, whether or not the display panel is bent, the brightness difference between the first and second display areas may be smaller.

Optionally, as shown in FIG. 1, the second display area 12 is a bendable area; and the first display area 11 and the second display area 12 are not on the same plane.

The display panel shown in FIG. 1 is the display panel having a bent structure, and may be applied to more scenarios. For example, through bending, different display areas are distinguished, and different contents are displayed in the different display areas.

Optionally, as shown in FIGS. 8 and 9, the display panel includes a plurality of first display areas 11 and a plurality of second display areas 12.

Optionally, as shown in FIGS. 8 and 9, each of the first display areas 11 and the second display areas 12 is strip-shaped.

Optionally, as shown in FIGS. 8 and 9, the first display areas 11 and the second display areas 12 are alternately arranged.

In a manufacture process of the display panel, it is required to use laser to irradiate an active layer of the driving transistors in a manner that the laser gradually irradiates the display panel from one end to the other end. During irradiation, due to process limitations, the intensity of the laser changes periodically. For example, in the first stage, the average intensity of the laser is 80%; in the second stage, the average intensity of the laser is 90%; in the third stage, the average intensity of the laser is 80%; and in the fourth stage, the average intensity of the laser is 90%. In this way, it will cause that the irradiated display panel is divided into a plurality of strip-shaped areas according to different irradiation periods. The active layers of the driving transistors in adjacent areas are irradiated with different intensities of lasers, so that there is a difference between operating characteristics of the driving transistors in the adjacent areas, resulting in a brightness difference in the adjacent areas. Therefore, it is possible to set different width-length ratios for driving transistors in different areas irradiated by different intensities of lasers, so as to compensate for the brightness difference caused by different intensities of the irradiation lasers.

Figure 10:
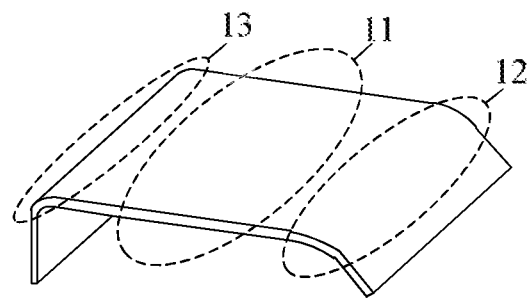
FIG. 10 is a schematic structural view of still another display panel according to an embodiment of the present disclosure.

Optionally, as shown in FIG. 10, FIG. 10 is a schematic structural view of another display panel according to an embodiment of the present disclosure. The display panel further includes a third display area 13 in which a third driving transistor is arranged; and a width-length ratio of the second driving transistor is greater than that of the third driving transistor 13.

The third display area 13 is also a bendable display area; and a bending curvature of the third display area 13 is smaller than that of the second display area 12. Therefore, in order to enable the brightness of the first display area 11, the second display area 12, and the third display area 13 to be nearly the same through compensation, the width-length ratio of the third driving transistor 13 needs to be smaller than that of the second driving transistor 12.

It should be noted that in the embodiment shown in FIG. 10, the bending curvature of the third display area 13 is smaller than that of the second display area 12, and a bending extent of the third display area is greater than that of the second display area. After bending, an increment value of the width-length ratio of the third display area is greater than that of the width-length ratio of the second display area. By setting the width-length ratio of the second driving transistor greater than that of the third driving transistor, and setting the width-length ratio of the first driving transistor greater than that of the second driving transistor, a difference among the width-length ratios of the first, second and third display areas caused by bending may be reduced, so as to improve the brightness uniformity of the first, second and third display areas after bending, and improve the display effect. It should be noted that the embodiment of the present disclosure is not limited to three display areas, and is also suitable for a plurality of display areas as long as width-length ratios of a bendable area and a non-bendable area is different. Moreover, embodiments in which a width-length ratio of a bendable area is preset to be smaller than that of a non-bendable area according to a bending curvature radius, and the smaller the curvature radius is, the smaller the width-length ratio will be in the protection scope of the present disclosure.

Figure 11:
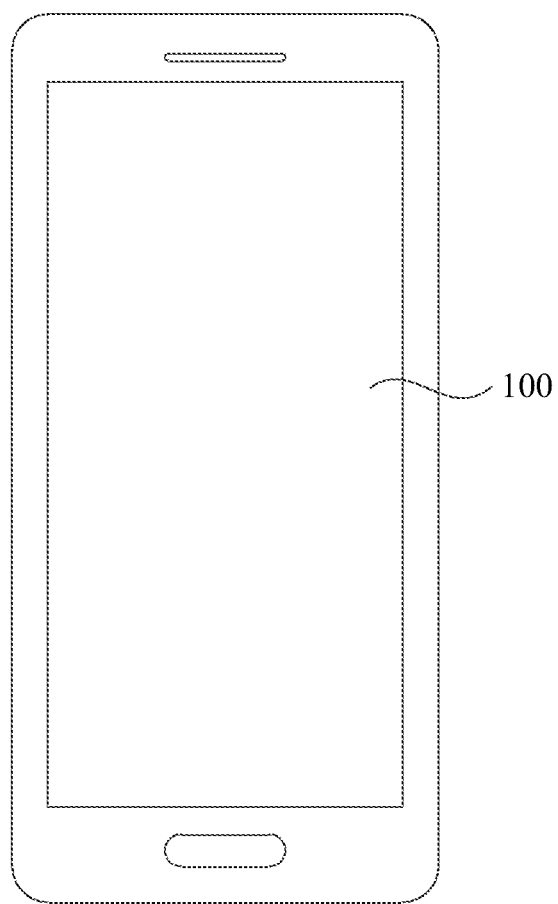
FIG. 11 is a schematic structural view of a display device according to an embodiment of the present disclosure.

The embodiments of the present disclosure further provide a display device. As shown in FIG. 11, FIG. 11 is a schematic structural view of a display device according to an embodiment of the present disclosure. The display device includes the above-described display panel 100.

Here, the display device may be any electronic device having a display function, such as a touch display screen, a cellphone, a tablet computer, a notebook computer, or a television. A specific structure and principle of the display panel 100 are the same as those of the display panels described in the above embodiments, and will not be repeated here.

With respect to the display device provided by the embodiment of the present disclosure, in the display panel, the first driving transistor is arranged in the non-bendable first display area; and the second driving transistor is arranged in the bendable second display area, the width-length ratio of the first driving transistor is greater than that of the second driving transistor. On one hand, after the second display area is bent, the width-length ratio of the second driving transistor is increased to be close to the width-length ratio of the first driving transistor. That is, after the second display area is bent, a difference between driving current values of the first and second driving transistors is decreased, so that a brightness difference caused by the different width-length ratios of the driving transistors at a bending position and a non-bending position is improved. On the other hand, at the same bending condition, the smaller the width-length ratio of the driving transistor is, the smaller the brightness difference caused by the bending of the driving transistors will be. Thus, the width-length ratio of the first driving transistor is set to be greater than that of the second driving transistor, namely, the driving transistor with the smaller width-length ratio being arranged in the bendable second display area, so that the anti-bending performance of the second display area is improved, and influence of bending on the brightness becomes smaller.

At last, it should be noted that the above embodiments are merely provided for describing the technical solutions of the present disclosure, but not intended to limit the same.

Although the present disclosure has been described in detail with reference to the above embodiments, those skilled in the art will appreciate that the technical solutions described in the above embodiments may be modified, or part of or all of technical features in the embodiments may be replaced with equivalents, without departing from the scopes of the technical solutions of the embodiments of the present disclosure.

What is claimed is:

1. A display panel, comprising:
an array substrate having a display area and a non-display area surrounding the display area, wherein the display area comprises:
a first display area being non-bendable;
a second display area being bendable;
a plurality of first pixel diving circuits, each including a plurality of first driving transistors, arranged in the first display area; and
a plurality of second pixel diving circuits, each including a plurality of second driving transistors, arranged in the second display area;
wherein a first width-length ratio of each of the plurality of first driving transistors is greater than a second width-length ratio of each of the plurality of second driving transistors;
wherein a plurality of first organic light emitting diodes each corresponding to a respective first pixel driving circuit of the plurality of first pixel driving circuits is arranged in the first display area, wherein each of the plurality of first organic light emitting diodes comprises an anode and a cathode, wherein the anode is coupled to the plurality of first driving transistors in a respective first pixel driving circuit;
wherein a plurality of second organic light emitting diodes each corresponding to a respective second pixel driving circuit of the plurality of second pixel driving circuits is arranged in the second display area, wherein each of the plurality of second organic light emitting diodes comprises an anode and a cathode, wherein the anode of the second organic light emitting diode is coupled to the plurality of second driving transistors in a respective second pixel driving circuit;
wherein a difference between the first width-length ratio and the second width-length ratio is j, and a ratio of j to the first width-length ratio is k, and wherein k is smaller than 70%.

2. The display panel according to claim 1,
wherein a number of the transistors of the plurality of first driving transistors in one of the first pixel driving circuits is the same as a number of the transistors of the plurality of second driving transistors in one of the second pixel driving circuits.

3. The display panel according to claim 1,
wherein the first display area comprises a plurality of first pixel driving circuits, wherein each of the plurality of first pixel driving circuits includes one of the plurality of first driving transistors;
wherein the second display area comprises a plurality of second pixel driving circuits, wherein each of the plurality of second pixel driving circuits includes one of the plurality of second driving transistors; and
wherein a number of transistors of the plurality of first driving transistors in one of the first pixel driving circuits is different from a number of transistors of the plurality of second driving transistors in one of the second pixel driving circuits.

4. The display panel according to claim 3,
wherein the number of transistors of the plurality of first driving transistors in one of the first driving circuits is greater than the number of transistors of the plurality of second driving transistors in one of the second driving circuits.

5. The display panel according to claim 4,
wherein each of the plurality of first pixel driving circuits comprises six transistors of the plurality of second driving transistors and one capacitor; and
wherein each of the plurality of second pixel driving circuits comprises five transistors of the plurality of second driving transistors and one capacitor.

6. The display panel according to claim 4,
wherein each of the plurality of first pixel driving circuits comprises of six transistors of the plurality of first driving transistors and one capacitor; and
wherein each of the plurality of second pixel driving circuits comprises of two transistors of the plurality of second driving transistors and one capacitor.

7. The display panel according to claim 4, further comprising:
a first pixel driving chip electrically connected to the plurality of first pixel driving circuits and the plurality of second pixel driving circuits.

8. The display panel according to claim 4, further comprising:
a first pixel driving chip electrically connected to the plurality of first pixel driving circuits; and
a second pixel driving chip electrically connected to the plurality of second pixel driving circuits.

9. The display panel according to claim 1, wherein the display panel is a flexible display panel.

10. The display panel according to claim 9, wherein when the second display area is bent, the first display area and the second display area are not aligned in a same plane.

11. The display panel according to claim 1, wherein the display panel comprises a plurality of the first display areas and a plurality of the second display areas.

12. The display panel according to claim 1, wherein the first display area and the second display area each is stripe-shaped.

13. The display panel according to claim 12, wherein the first display area comprises a plurality of first display sub-areas, and the second display area comprises a plurality of second display sub-areas; and
wherein the plurality of first display sub-areas and the plurality of second display sub-areas are alternately arranged.

14. The display panel according to claim 1, wherein the array substrate further comprises:
a third display area, wherein a third driving transistor is arranged in the third display area, wherein the second width-length ratio of the second driving transistor is greater than a width-length ratio of the third driving transistor.

15. A display device, comprising: a display panel, wherein the display panel comprises:
an array substrate having a display area and a non-display area surrounding the display area, wherein the display area comprises:
a first display area being non-bendable;
a second display area being bendable;
a plurality of first pixel diving circuits, each including a plurality of first driving transistors, arranged in the first display area; and a plurality of second pixel diving circuits, each including a plurality of second driving transistors, arranged in the second display area;

wherein a first width-length ratio of each of the plurality of first driving transistors is greater than a second width-length ratio of each of the plurality of second driving transistors;

wherein a plurality of first organic light emitting diodes each corresponding to a respective first pixel driving circuit of the plurality of first pixel driving circuits is arranged in the first display area, wherein each of the plurality of first organic light emitting diodes comprises an anode and a cathode, wherein the anode is coupled to the plurality of first driving transistors in a respective first pixel driving circuit;

wherein a plurality of second organic light emitting diodes each corresponding to a respective second pixel driving circuit of the plurality of second pixel driving circuits is arranged in the second display area, wherein each of the plurality of second organic light emitting diodes comprises an anode and a cathode, wherein the anode of the second organic light emitting diode is coupled to the plurality of second driving transistors in a respective second pixel driving circuit;

wherein a difference between the first width-length ratio and the second width-length ratio is j, and a ratio of j to the first width-length ratio is k, and wherein k is smaller than 70%.

* * * * *